(12) United States Patent
Nallan

(10) Patent No.: US 6,503,845 B1
(45) Date of Patent: Jan. 7, 2003

(54) METHOD OF ETCHING A TANTALUM NITRIDE LAYER IN A HIGH DENSITY PLASMA

(75) Inventor: Padmapani Nallan, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/846,580

(22) Filed: May 1, 2001

(51) Int. Cl.[7] ............................................. H01L 21/302
(52) U.S. Cl. ....................... 438/714; 438/720; 438/742; 216/67; 216/75
(58) Field of Search ................................ 438/720, 742, 438/714; 216/67, 75

(56) References Cited

U.S. PATENT DOCUMENTS

| | | | |
|---|---|---|---|
| 4,498,953 A | * 2/1985 | Cook et al. ............... | 156/646 |
| 5,521,114 A | * 5/1996 | Rajeevakumar ........... | 437/60 |
| 5,741,626 A | * 4/1998 | Jain et al. ................. | 430/314 |
| 5,753,044 A | 5/1998 | Hanawa et al. ........... | 118/723 I |
| 5,888,588 A | 3/1999 | Nagabushnam et al. . | 427/248.1 |
| 6,004,850 A | 12/1999 | Lucas et al. .............. | 438/301 |
| 6,008,140 A | 12/1999 | Ye et al. ................... | 430/318 |
| 6,033,939 A | 3/2000 | Agarwala et al. ......... | 438/132 |
| 6,071,806 A | 6/2000 | Wu et al. .................. | 438/622 |
| 6,080,529 A | 6/2000 | Ye et al. ................... | 430/318 |
| 6,090,696 A | 7/2000 | Jang et al. ................ | 438/617 |
| 6,162,587 A | * 12/2000 | Yang et al. ............... | 430/314 |
| 6,261,406 B1 | * 7/2001 | Jurgensen et al. ........ | 156/345 |

FOREIGN PATENT DOCUMENTS

| EP | 1041615 | | 3/2000 |
|---|---|---|---|
| JP | 2000082695 | * | 3/2000 |

OTHER PUBLICATIONS

Diefendorff Keith. "Intel Raises the Ante With P858; Details of Next–Generation 0.18–Micron Process Disclosed." *Microprocessor Report*, 13, 1, NA. (Jan. 1999).

Jung et al. "Electron Cyclotron Resonance Plasma Etching of Materials for Magneto–Resistive Random Access Memory Applications." *Journal of Electronic Materials*. vol. 26, No. 11. (1997). pp. 1310–1313.

Mehrotra et al. "Properties of direct current magnetron reactively sputtered TaN." *Journal of Vacuum Science & Technology B.* vol. 5, No. 6 (Nov.–Dec. 1987). pp. 1736–1740.

Chow et al. "Plasma etching of refractory gates for VLSI applications." *J. Electrochem. Soc.: Solid–State Science and Technology.* vol. 131, No. 10. (Oct. 1984). pp. 2325–2335.

* cited by examiner

Primary Examiner—George Goudreau
(74) Attorney, Agent, or Firm—Shirley L. Church; Kathi Bean; Joseph Bach

(57) ABSTRACT

A method of plasma etching a patterned tantalum nitride layer, which provides an advantageous etch rate and good profile control. The method employs a plasma source gas comprising a primary etchant to provide a reasonable tantalum etch rate, and a secondary etchant/profile-control additive to improve the etched feature profile. The primary etchant is either a fluorine-comprising or an inorganic chlorine-comprising gas. Where a fluorine-comprising gas is the primary etchant, the profile-control additive is a chlorine-comprising gas. Where the chlorine-comprising gas is the primary etchant, the profile-control additive is an inorganic bromine-comprising gas. By changing the ratio of the primary etchant to the profile-control additive, the etch rate and etch profile of the tantalum nitride can be controlled. For best results, the plasma is preferably a high density plasma (minimum electron density of $10^{11} e^-/cm^3$), and a bias power is applied to the semiconductor substrate to increase the etching anisotropy.

25 Claims, 3 Drawing Sheets

METHOD OF ETCHING A TANTALUM NITRIDE LAYER IN A HIGH DENSITY PLASMA

BACKGROUND OF THE INVENTION

1. Field of the Invention

The present invention pertains to a method of etching a layer of tantalum nitride within a semiconductor structure. The method of the invention is particularly useful in etching patterned structures such as a tantalum nitride gate, but may also be used for surface etch back of a tantalum nitride layer.

2. Brief Description of the Background Art

The use of metal or metal nitride gates within semiconductor structures is a relatively new concept in the art of semiconductor manufacture. Tantalum (Ta) and tantalum nitride (TaN) are two of the materials that are under investigation for use in gates.

Tantalum and tantalum nitride have been frequently used in the past as barrier layer materials in copper metallization structures, to prevent the migration of silicon from an underlying substrate into an overlying copper metallization layer. Among the refractory metals, molybdenum and tungsten have been widely recommended as MOS gates on grounds that the gate material must be stable with respect to the gate dielectric, which is typically $SiO_2$ or $Si_3N_4$. The use of metals such as titanium and tantalum has been considered unpromising because such materials have been considered to be too reactive with oxides and nitrides at higher semiconductor processing temperatures (for example, at temperatures of approximately 600° C. or greater).

The etching of molybdenum has been carried out using $CF_4$, with a small amount of oxygen added to increase the etch rate. In the alternative, $NF_3$ or $SF_6$ has been used, rather than the $CF_4/O_2$ combination, to provide for the more rapid generation of fluorine atoms or radicals. Dilution of the $NF_3$ or $SF_6$ with a conventional diluent, such as Ar or He, may increase process control while yielding a reduced metal etch rate.

Etching of layers of some refractory metal nitrides, including tungsten nitride, used in interconnect applications has been done utilizing various etching agents, and combinations of agents, including chlorine-comprising gases (such as $Cl_2$, a mixture of $Cl_2/O_2$, or a mixture of HCl, $N_2$, and $BCl_3$) or fluorine-comprising gases (such as $CF_4$ or $CF_4/CHF_3$. (See U.S. Pat. Nos. 5,888,588, 6,080,529, 6,008,140, and 6,004,850.)

Additional information pertaining to the etching of tantalum nitride layers in general may be found in Jung, et al, "Electron Cyclotron Resonance Plasma Etching of Materials for Magneto-Resistive Random Access Memory Applications," *J. Electronic Materials*, Vol. 26, pp. 1310–1313 (Nov. 1997), and Chow et al., "Plasma etching of refractory gates for VLSI applications". *J. Electrochem. Soc.*, Vol. 131, No. 10, pp. 2325–2335 (1984), for example.

If tantalum nitride is to be used as a gate material, in combination with an underlying dielectric material, to provide a stable overall gate structure, it is necessary to provide a method of plasma etching the tantalum nitride gate material at an etch rate which is sufficiently rapid for commercial production purposes, but with adequate selectivity for etching the tantalum nitride in preference to the underlying dielectric material, and with good control over etch profile. The plasma etchant composition must be carefully tailored to the particular material being etched, in order to obtain such a vertical sidewall profile. There appears to be no information in the literature relating to obtaining a vertical profile in gate structures etched in tantalum nitride.

SUMMARY OF THE INVENTION

We have discovered a method of plasma etching a patterned tantalum nitride layer, which is particularly useful in etching solid-state device gate structures. A tantalum nitride layer is etched, in a high-density plasma etching chamber, with a source gas comprising a primary etchant, in combination with a profile-control additive, which provides control over the sidewall profile of etched features. An inorganic chlorine-comprising gas or a fluorine-comprising gas can serve as the primary etchant.

When an inorganic chlorine-comprising gas, such as $Cl_2$, HCl, or $BCl_3$, is selected as the primary etchant, an inorganic bromine comprising gas, such as HBr, is used as the profile-control additive. This combination would be preferred where the semiconductor structure utilizes an inorganic hardmask rather than an organic photoresist mask, because the bromine-comprising gas provides a passivating effect which compensates for the absence of such an effect from carbon contributed to the plasma by the breakdown of a photoresist. When this etchant combination is used with an organic photoresist present, the resulting sidewall passivation may result in a tapered etch profile. To reduce the amount of taper, the substrate is more highly biased during etching.

When a fluorine-comprising gas, such as $SF_6$, $NH_3$, or $CF_4$ is selected as the primary etchant, an inorganic chlorine-comprising gas, such as $Cl_2$, HCl, or $BCl_3$, is used as the profile-control additive. Use of this combination of etchant gases would be preferred in etching structures having an exposed organic photoresist layer, where the photoresist contributes carbon to the plasma as it breaks down, providing a substantial passivating effect. In particular, use of a source gas consisting of appropriate proportions of fluorine-comprising and chlorine-comprising gases, in the presence of an organic photoresist or other source of carbon in the plasma, produces a vertical feature profile. If this etchant combination is used to etch structures in which an inorganic hardmask layer is used and there is no exposed layer of organic photoresist or other source of carbon in the plasma, a lower ratio of fluorine-comprising to chlorine-comprising gas will be appropriate, to avoid undercutting of the feature profile.

To achieve best results using the method of the invention, the plasma is preferably a high density plasma having an electron density of at least $10^{11} e^-/cm^3$. In addition, a bias power is applied to the semiconductor substrate to provide more anisotropic etch conditions. The invention is capable of producing vertical (about 88° to 90°) profile sidewalls for etched tantalum nitride lines.

DETAILED DESCRIPTION OF THE PREFERRED EMBODIMENTS

Figure 1:
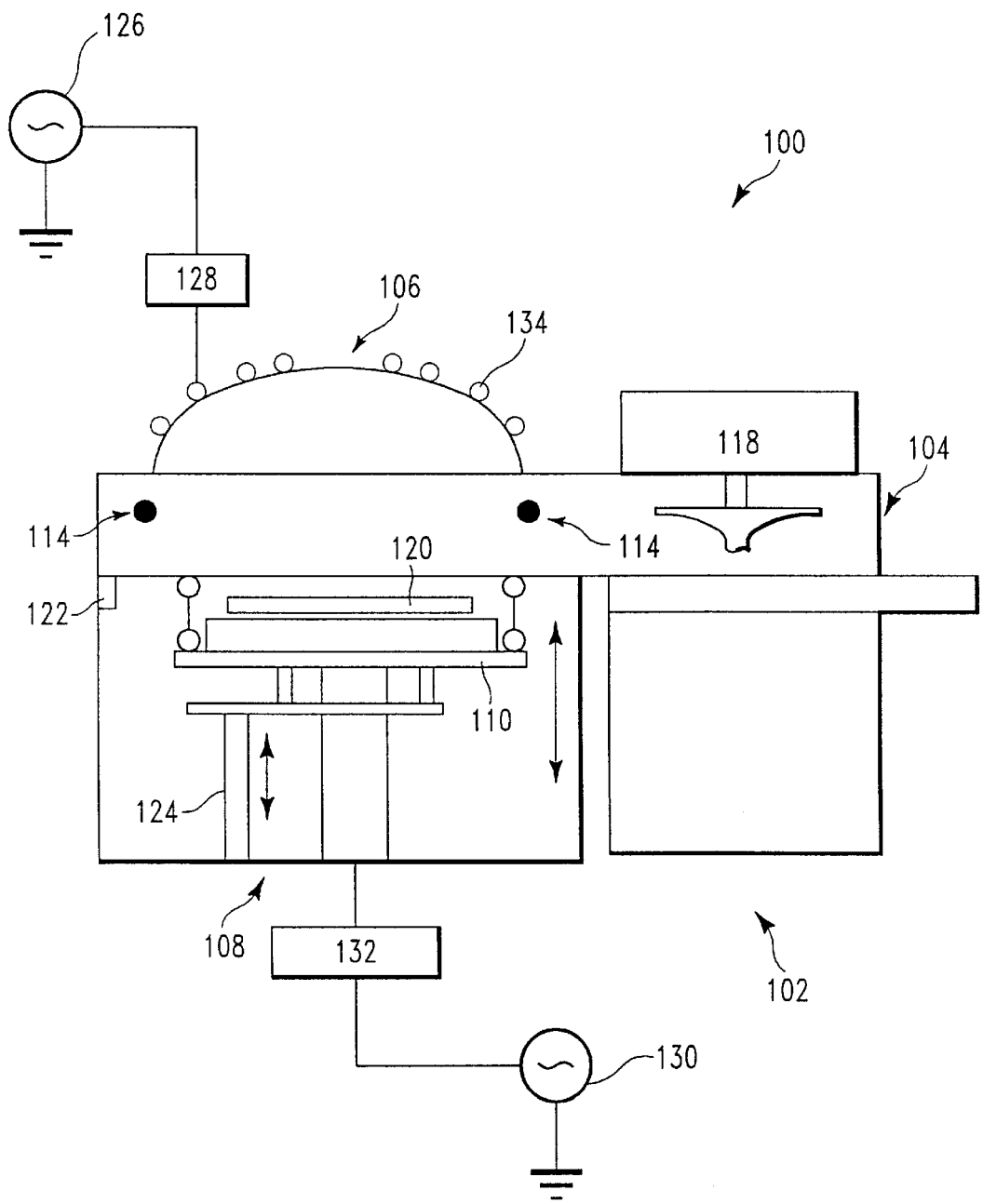
FIG. 1 shows an example of an apparatus which can be used to carry out the etching processes described herein.

Described in detail below is a method of etching a layer of tantalum nitride. In particular, the method comprises exposing the layer of tantalum nitride to a high-density plasma generated from a source gas comprising a primary etchant and a profile control additive. Preferred processing conditions for performing the method of the invention are set forth below.

As a preface to the detailed description, it should be noted that, as used in this specification and the appended claims, the singular forms "a", "an", and "the" include plural referents, unless the context clearly dictates otherwise.

The invention comprises using a high-density plasma to etch desired features in a tantalum nitride gate or other structure of a semiconductor device. In some of the embodiments of the invention, the plasma source gas comprises a combination of an inorganic chlorine-comprising gas, selected from a group which includes $Cl_2$ and HCl, among others, as the primary etchant, and an inorganic bromine-comprising gas, selected from a group which includes HBr, among others, as a profile control additive. In other embodiments, the plasma source gas comprises a fluorine-comprising gas, selected from a group which includes, among others, $CF_4$, $NF_3$ and $SF_6$, as a primary etchant, and an inorganic chlorine-comprising gas, selected from a group which includes $Cl_2$ and HCl, among others, as a profile control additive. When organic photoresist material is also present, the carbon added to the plasma by the breakdown of this photoresist material also contributes to the ability to control the feature etch profile on the etched device. Where a hardmask, such as an oxide or nitride layer, is used rather than an organic photoresist mask, it may be necessary, in order to maintain an acceptable edge profile, to otherwise introduce carbon into the plasma, or to add or increase HBr in the plasma source gas, in order to increase the degree of sidewall passivation, and/or to increase the bias power in order to increase anisotropy of etching.

In one of the embodiments, the etchant plasma source gases are $Cl_2$ as the primary etchant and HBr as the profile-control additive, in varying proportions. This combination of primary etchant and profile control additive is preferable when a hardmask is used rather than an organic photoresist mask. In another of the embodiments, the etchant plasma source gases are $NF_3$ as the primary etchant, and $Cl_2$ as the profile-control additive, in varying proportions. This combination will be most useful when there is an organic photoresist layer present in the etched structure, or other source of carbon in the plasma.

In one particular embodiment, the etchant source gases are $NF_3$ as the primary etchant and $Cl_2$ as the profile-control additive, with the volumetric ratio of $NF_3$: $Cl_2$ in the range of from about 10:1 to about 1:10, and preferably in the range of from about 3:1 to about 1:3.

I. AN APPARATUS FOR PRACTICING THE INVENTION

The embodiment etch processes described herein were carried out in a CENTURA® Integrated Processing System, available from Applied Materials, Inc., of Santa Clara, Calif. The system is shown and described in U.S. Pat. No. 5,753,044, the disclosure of which is hereby incorporated by reference. Although the etch process chamber used in the Examples presented herein is shown in schematic in FIG. 1, any of the etch processors available in the industry should be able to take advantage of the etch chemistry described herein, with some adjustment to process parameters. The equipment shown in schematic in FIG. 1 includes a Decoupled Plasma Source (DPS) of the kind described by Yan Ye et al. at the Proceedings of the Eleventh International Symposium of Plasma Processing (May 7, 1996) and published in the *Electrochemical Society Proceedings* (Volume 96–12, pp. 222–233, 1996), which is hereby incorporated by reference. The plasma processing chamber enables the processing of an 8 inch (200 mm) or a 12 inch (300 mm) diameter wafer.

FIG. 1 shows a schematic of a side view of an individual CENTURA® DPS™ polysilicon etch chamber 100. The etch chamber 100 consists of an upper chamber 104 having a ceramic dome 106, and a lower chamber 108. The lower chamber 108 includes a monopolar electrostatic chuck (ESC) cathode 110. Gas is introduced into the chamber via gas injection nozzles 114 for uniform gas distribution. Chamber pressure is controlled by a closed-loop pressure control system (not shown) using a throttle valve 118. During processing, a substrate 120 is introduced into the lower chamber 108 through inlet 122. The substrate 120 is held in place by means of a static charge generated on the surface of electrostatic chuck (ESC) cathode 110 by applying a DC voltage to a conductive layer (not shown) located under a dielectric film (not shown) on the chuck surface. The cathode 110 and substrate 120 are then raised by means of a wafer lift 124 and sealed against the upper chamber 104 in position for processing. Etch gases are introduced into the upper chamber via gas injection nozzles 114. The etch chamber 100 uses an inductively coupled plasma source power 126 and matching network 128 operating at 12.56 MHZ for generating and sustaining a high density plasma. The wafer is biased with an RF source 130 and matching network 132 operating at 13.56 MHZ. Plasma source power 126 and substrate biasing means 130 are controlled by separate controllers (not shown).

Although the Examples provided herein were carried out using an inductively coupled etch system, a capacitive etch tool, such as an eMaX™ CENTURA® etch system (not shown), available from Applied Materials, Inc., could also be used in the etch processes described herein, although an adjustment to process conditions from those described in the following discussion would be required.

II. METHOD OF ETCHING TANTALUM NITRIDE

Figure 2A:
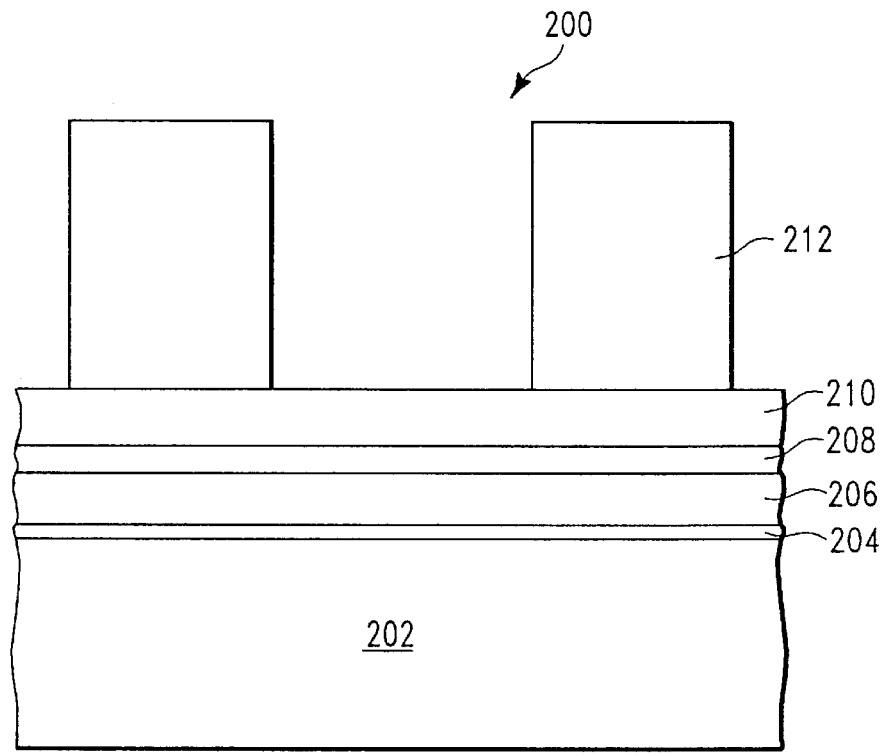
FIG. 2A shows a beginning semiconductor structure 200 for performing the method of the invention. The semiconductor structure 200 includes, from top to bottom, a patterned layer 212 of photoresist, a buried anti-reflective coating ("BARC") layer 210, a dielectric anti-reflective coating ("DARC") layer 208, a tantalum nitride layer 206, and a dielectric layer 204, all deposited on a silicon substrate 202. The relative thicknesses of the film stack layers are not shown to scale.

Referring to the figures, FIG. 2A shows a beginning semiconductor structure 200 of the kind which is illustrative of the method of the invention. FIG. 2A is not to scale. The semiconductor structure 200 includes, from top to bottom, a patterned layer 212, which is typically a photoresist, but which may be a hardmasking layer; an optional buried anti-reflective coating ("BARC") layer 210; a dielectric anti-reflective coating ("DARC") layer 208; a tantalum nitride gate layer 206; and a dielectric layer 204, all deposited on a semiconductor substrate 202.

For a given required feature dimension, the thickness and patterning method for the photoresist layer 212 will depend on the particular photoresist material used. Photoresist layer 212 may be any suitable organic photoresist material known in the art. A frequently used photoresist is a DUV (Deep U.V.) photoresist available from either JSR® Microelectronic of Sunnyvale, Calif., or SHIPLEY®, INC. of Marlboro, Mass. A typical film thickness for such a DUV photoresist ranges from about 4000 Å to about 10,000 Å.

The BARC layer 210 is typically an organic material, selected from suitable materials, including but not limited to materials such as poly(vinylpyridine); polyimide; negative photoresist containing a DUV dye; certain acrylic polymers and copolymers, such as glycidyl methacrylate reacted with non-polycyclic carboxylic dyes and non-polycyclic phenolic dyes; hydroxyalkyl acrylate or methacrylate; hydrocycloalkyl acrylate or methacrylate; hydroxyalkylcycloalkyl acrylate or methacrylate; and glycidyl methacrylate; and various combinations thereof. The thickness of such a BARC layer ranges from about 500 Å to about 500 Å.

The DARC layer 208 is typically an inorganic material, such as silicon oxynitride. The DARC layer commonly has a thickness within the range of about 300 Å to about 600 Å.

The tantalum nitride layer 206, from which the gate is to be formed, typically exhibits a thickness within the range of about 500 Å to about 2000 Å. The tantalum nitride gate layer 206 is typically deposited using conventional methods known in the art, such as chemical vapor deposition (CVD) or physical vapor deposition (PVD).

The dielectric layer 204 is typically an oxide, such as silicon oxide or tantalum pentoxide, or other high k dielectric material. The thickness of dielectric layer 204 typically ranges from about 20 Å to about 50 Å for silicon oxide or tantalum pentoxide. Thinner layers offer better device performance, so eventually such dielectric layers will tend toward the lower thicknesses, much less that 50 Å, for whatever high k material is selected. A thickness of 12–15 Å for a silicon oxide layer, or 20 Å for tantalum pentoxide, is advantageous, but tunneling becomes a problem at lower thicknesses. Such dielectric layers are typically deposited using conventional methods known in the art, such as thermal oxidation or plasma-enhanced chemical vapor deposition (PECVD).

The semiconductor substrate is typically silicon.

Figure 2B:
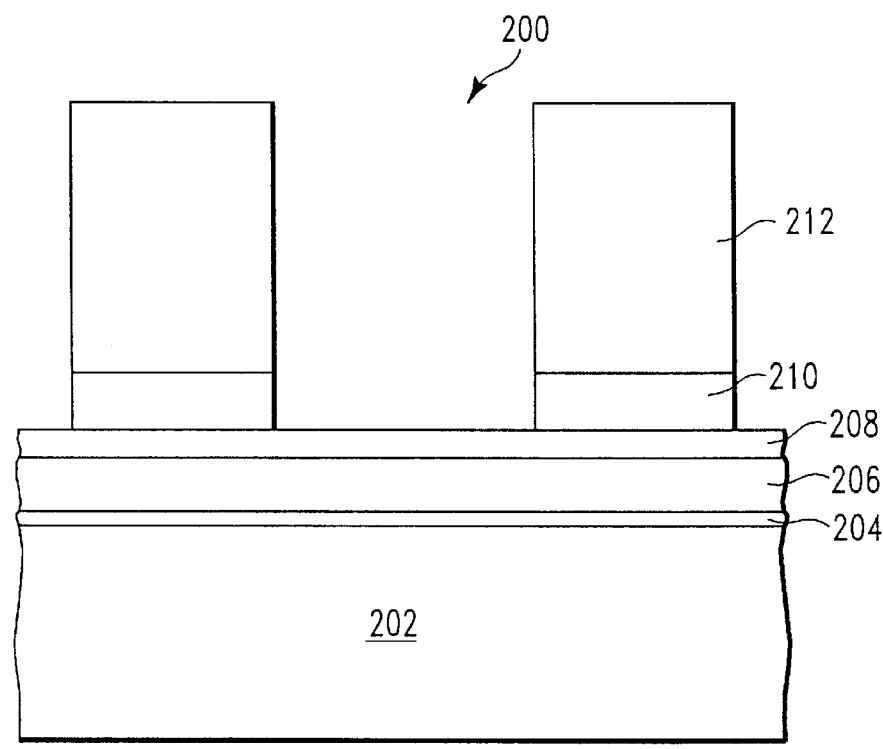
FIG. 2B shows the semiconductor structure 200 after etching of the BARC layer 210.
Figure 2C:
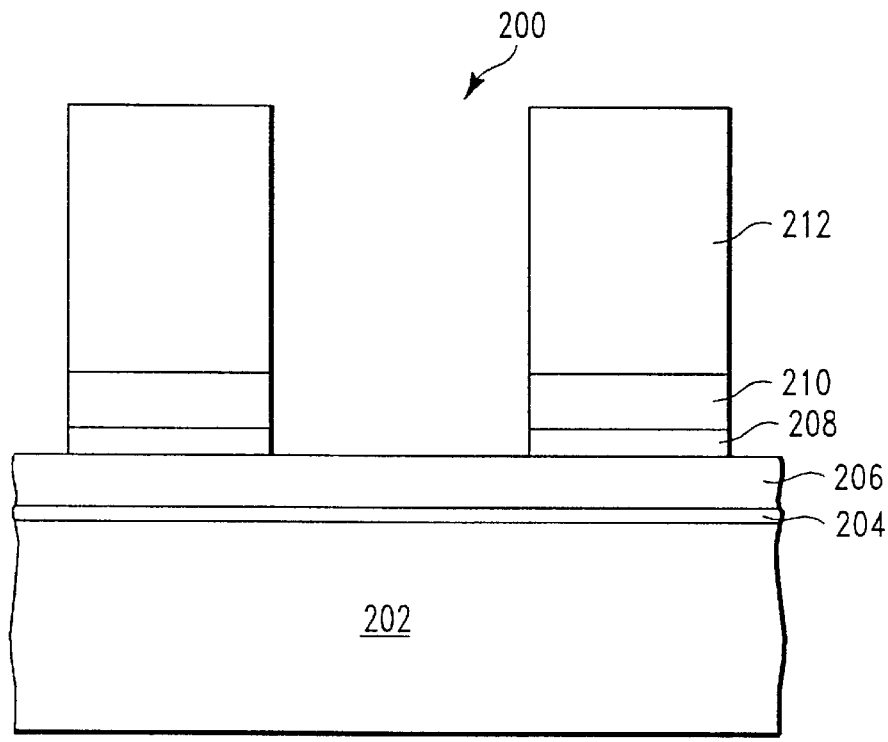
FIG. 2C shows the semiconductor structure 200 after etching of the DARC layer 208.
Figure 2D:
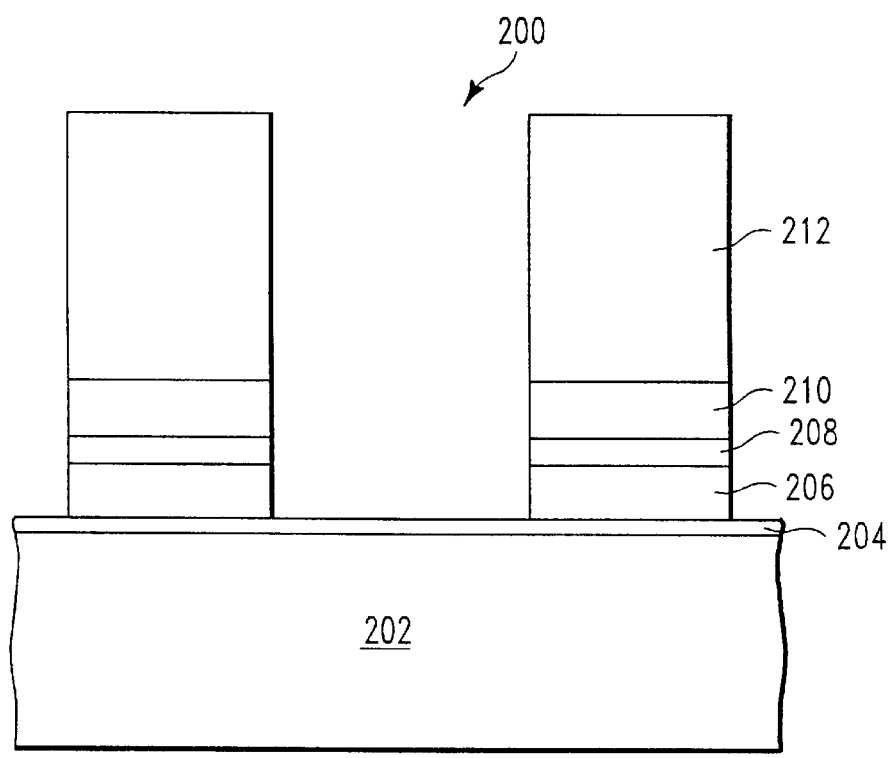
FIG. 2D shows the semiconductor structure 200 after etching the tantalum nitride gate layer 206, exposing the underlying dielectric layer 204.

After patterning of the photoresist layer 212 to achieve the structure shown in FIG. 2A, the BARC layer 210 and DARC layer 208 are etched, as shown in FIGS. 2B and 2C, using conventional etch chemistry and methodology known in the art, depending on the particular materials which form the two layers, to expose a surface of the tantalum nitride gate layer 206.

The organic BARC layer is typically etched using the following etch conditions: 40 sccm $Cl_2$/20 sccm $O_2$; 300 W plasma source power; 40 W bias power (which produces a substrate voltage of about −20 to about −100 V); a plasma density of about $10^{11}$ to about $10^{12} e^-/cm^3$, 2 mTorr process chamber pressure, a substrate temperature of about 50° C., and a chamber wall temperature of about 65° C. Etch time is typically about 30 seconds, depending on the thickness of the BARC layer.

When the DARC layer comprises silicon oxynitride, it is typically etched using the following process conditions: 80 sccm $CF_4$; 500 W plasma source power; 120 W substrate bias power (which produces a substrate voltage of about −120 to about −200 V); 4 mTorr process chamber pressure; a substrate temperature of about 50° C., and a chamber wall temperature of about 55° C. Etch time typically ranges from about 10 to about 30 seconds, depending on the thickness of the DARC layer.

After etching of the DARC layer 208, the tantalum nitride gate layer 206 is etched, using a plasma generated from a source gas comprising a combination of a primary etchant and a profile-control additive. Where the primary etchant is an inorganic chlorine-comprising gas, the profile-control additive is an inorganic bromine-comprising gas. Where the primary etchant is a fluorine-comprising gas, the profile control additive is an inorganic chlorine-comprising gas. The inorganic chlorine-comprising gas is typically selected from the group consisting of molecular chlorine ($Cl_2$), HCl, and $BCl_3$. The fluorine-comprising gas is typically selected from the group consisting of $CF_4$, $NF_3$, $SF_6$, and combinations thereof. The inorganic bromine-comprising gas is typically HBr.

The plasma source gas may optionally include a non-reactive diluent gas, such as, for example, argon, helium, xenon, neon, krypton, or combinations thereof. The concentration of the non-reactive diluent gas is typically less than about 50% by volume of the plasma source gas, depending upon the desired etch rate. Given the tendency toward ever-thinner gate structures, use of such non-reactive diluent gas dilution may be increasingly desirable in the future.

By changing the ratio of the primary etchant gas to the profile control gas in the plasma source gas, the etch rate and etch profile of the tantalum nitride layer can be accurately controlled. We have found that where the primary etchant is an inorganic chlorine-comprising gas and the profile control additive is an inorganic bromine-comprising gas, a volumetric ratio of primary etchant to profile-control additive within the range of about 3:1 to about 1:1, provides acceptable etch rates, but tapered etch profiles. We have also found that where the primary etchant gas is an inorganic flourine-comprising gas and the profile-control additive is an inorganic chlorine-comprising gas, a volumetric ratio of primary etchant to profile-control additive within the range of about 1:7.5 to about 3:1, provides both acceptable etch rates and a more vertical etch profile than is achieved using the aforementioned chlorine-comprising/bromine-comprising etchant gas combination.

In one of applicant's embodiments, the source gas combination uses an inorganic chlorine-comprising gas as primary etchant and an inorganic bromine-comprising gas as the profile-control additive, and the gases are delivered at a volumetric ratio of primary etchant to profile-control additive within the range of about 2:1 to about 1:1.

In another of applicant's embodiments, the source gas combination uses a fluorine-comprising gas as primary etchant and an inorganic chlorine-comprising gas as the profile-control additive, and the gases are delivered at a volumetric ratio of primary etchant to profile-control additive within the range of about 1:1 to about 3:2.

In another of applicant's embodiments, the primary etchant is $NF_3$ and the profile-control additive is $Cl_2$, and the gases are delivered in a volumetric ratio of $NF_3:Cl_2$ within the range of about 1:1 to about 3:2.

The entire thickness of the tantalum nitride gate layer 206 is etched, exposing the underlying dielectric layer 204. An emission or interferometric endpoint detection system may be used to detect breakthrough to the underlying dielectric layer 204. A timed endpoint may be used when the etch selectivity of the tantalum nitride layer 206 relative to dielectric layer 204 is at least 50:1, so that tantalum nitride can be etched rapidly relative to the dielectric layer, and etch-through of the dielectric layer avoided.

Typical process conditions for etching tantalum nitride according to the method of the invention are presented in Table One, below.

TABLE ONE

Typical Process Conditions for Etching Tantalum Nitride in a CENTURY ® DPS ™ Polysilicon Etch Chamber
Table 1-1, Etchant Combination of Inorganic Chlorine-Comprising gas as Primary Etchant, and Inorganic Bromine-Comprising Gas as Profile-Control Additive

| Process Parameter | Typical Process Conditions | Example Process Conditions | Optimum Example Conditions |
|---|---|---|---|
| Total Plasma Source Gas Flow Rate (sccm) | 30–400 | 50–200 | 75–125 |
| Chlorine-Comprising Gas Flow Rate (sccm) | 30–400 | 50–200 | 50–100 |
| Bromine-Comprising Gas Flow Rate (sccm) | 30–400 | 50–200 | 50–100 |
| Plasma Source Power* (W) | 300–2000 | 300–1000 | 300–500 |
| Substrate Bias Power** (W) | 30–200 | 50–100 | 50–75 |
| Substrate Voltage (V) | −30 to −200 | −50 to −100 | −50 to −75 |
| Process Chamber Pressure (mTorr) | 2–20 (main etch) 20–100 (overetch) | 2–10 | 2–6 |
| Process Chamber Wall Temp. (° C.) | 20–100 | 40–80 | 65 |
| Substrate Temperature (° C.) | 10–100 | 30–70 | 50 |

TABLE 1-2

Etchant Combination of Fluorine-Comprising Gas as Primary Etchant and Inorganic Chlorine-Comprising Gas as Profile-Control Additive

| Process Parameter | Typical Process Conditions | Example Process Conditions | Optimum Example Conditions |
|---|---|---|---|
| Total Plasma Source Gas Flow Rate (sccm) | 30–200 | 50–200 | 75–100 |
| Fluorine-Comprising Gas Flow Rate (sccm) | 5–100 | 10–75 | 40–60 |
| Chlorine-Comprising Gas Flow Rate (sccm) | 30–200 | 25–100 | 40–60 |
| Plasma Source Power* (W) | 300–2000 | 300–1000 | 300–500 |
| Substrate Bias Power** (W) | 30–200 | 40–100 | 40–60 |
| Substrate Voltage (V) | −30 to −200 | −40 to −100 | −40 to −60 |
| Process Chamber Pressure (mTorr) | 2–20 (main etch) 2–100 (overetch) | 2–10 | 2–4 |
| Process Chamber Wall Temp. (° C.) | 20–100 | 40–80 | 65 |
| Substrate Temperature (° C.) | 10–100 | 40–60 | 50 |

The term "source power" refers to the power that is applied to generate and sustain the plasma within the processing chamber.

The term "bias power" refers to the power applied to the substrate (typically, to the substrate support pedestal) to produce a negative voltage on the substrate surface. Generally, the negative voltage is used to attract high energy species to the substrate surface. The higher the negative voltage, the greater the attraction.

We performed various experimental runs during development of the tantalum nitride etch method of the invention. These experiments were performed using the following film stack (layers listed from top to bottom): a previously patterned layer, 5500 Å thick, of an unrecorded commercially available DUV photoresist; an unrecorded commercially available organic BARC layer, 600 Å thick; a $SiO_xN_y$ DARC layer, 300 Å thick; a TaN layer 470 Å thick; and a $SiO_2$ layer 35 Å thick, all deposited on a silicon substrate.

Ten experimental runs are described below. In each experimental run, after patterning of the photoresist layer, BARC and DARC etch steps were performed, to expose a surface of the tantalum nitride gate layer (as shown in FIG. 2B). For all test runs, the BARC etch step was performed using the following process conditions: 40 sccm $Cl_2$ and 20sccm $O_2$; 300 W plasma source power; 40 W bias power; 2 mTorr process chamber pressure; 50° C. substrate temperature; and 30 seconds +30% etch time. Each run, the DARC etch step was performed using the following process conditions: 20 sccm $CF_4$ and 150 sccm Ar; 600 W plasma source power; 80 W bias power; 4 mTorr process chamber pressure; 50° C. substrate temperature; and 20–22 seconds +20% etch time (except that in Run #1, etch time was 42.8 sec. +20%, and in Run #2 no endpoint was seen nor etch time recorded.)

COMPARATIVE EXAMPLES

The underlying tantalum nitride gate layer was then etched (as shown in FIG. 2C). Etching of the tantalum nitride layer in Runs #1 and 2 was performed using single plasma source gases. $Cl_2$ gas only was used in Run #1. For Run #1, the tantalum nitride etch step was performed using the following process conditions: 50 scCm $Cl_2$; 300 W plasma source power; 50 W bias power; 4 mTorr process chamber pressure; 50° C. substrate temperature; and 16.1 seconds etch time. The etch rate was approximately 1750 Å/min.(although there was a failure on this run to catch the correct endpoint), resulting in an etch which went deeply into the silicon substrate.

The term "etch profile" (or "feature profile"), as used in this document, generally refers to, but is not limited to, a cross-sectional view of a gate structure, as shown in FIGS. 2A through 2C, and is described in terms of an angle between the etched sidewall of a gate layer and a horizontal line at the upper surface of the underlying layer of silicon oxide. The term "vertical profile" refers to a cross-sectional view of the etched gate layer, where the sidewalls of the etched gate layer are essentially perpendicular to the silicon oxide surface. The term "undercut" profile refers to a cross-sectional view of the etched gate layer, where the width of the etched opening is larger as the distance away from the opening on the substrate increases. The term "tapered" profile refers to a cross-sectional view of the etched gate layer, where the width of the etched opening is smaller as the distance away from the opening on the substrate surface increases. The term "critical dimension" typically refers to the smallest dimension of the feature which must be controlled to produce the desired structure.

Run #2 utilized HBr, at 50 sccm, as the sole plasma source gas, with the plasma source power set at 300 W, the bias power set at 50 W, and a substrate temperature of 50° C. Once again, there was a problem detecting the endpoint. The plasma was observed to be unstable, very little power was delivered, and almost no etching by the HBr occurred in the TaN layer.

It would thus appear that neither $Cl_2$ alone, nor HBr, alone, is a very practical source gas for plasma etching a tantalum nitride gate in a semiconductor device.

METHOD OF THE INVENTION EXAMPLES

In experimental runs #3–6, we investigated the use of a combination of an inorganic chlorine-comprising gas (acting as the primary etchant), and an inorganic bromine-comprising gas (intended to act as a profile-control additive) included in the plasma source gas.

In particular, plasma source gas compositions comprising various combinations of molecular chlorine ($Cl_2$) and hydrogen bromide (HBr) were evaluated. Runs #3, #4, and #6 utilized a plasma source gas composition comprising 50 sccm $Cl_2$ in combination with 50 sccm HBr; Run #5 utilized a plasma source gas comprising 75 sccm of $Cl_2$, and 25 sccm of HBr.

Tantalum nitride etch process conditions for Run #3 were as follows: 300 W plasma source power; 50 W bias power; 4 mTorr process chamber pressure; 50° C. substrate temperature; and 40 seconds etch time. These process conditions showed no issues with resist selectivity, and produced an etch rate of approximately 700 Å/min., but also a very tapered (85° angle) feature profile.

In Run #4, the source power was increased from 300 to 500 W. Etch time was 29 sec. All other variables were held constant with reference to Run #3. The use of a higher source power produced an etch rate of approximately 970 Å/min., and had no apparent effect on the etch profile.

In Run #5, the source power was returned to 300 W, and the source gas composition changed to 75 sccm $Cl_2$ and 25 sccm HBr, with an etch time of 25 sec, and all other variables held constant with reference to Run #3. The use of this larger ratio of $Cl_2$ to HBr produced an etch rate of approximately 1130 Å/min., and resulted in a more tapered etch profile, as compared to Run #3 or #4.

In Run #6, the process chamber pressure was increased to 8 mTorr, with an etch time of 49 sec., and all other variables held constant with reference to Run #3. The use of a higher process chamber pressure produced an etch rate of approximately 570 Å/min., and resulted in a more tapered etch profile, as compared to Run #3 or #4.

In hopes that a different plasma source gas combination may produce better profile control, we substituted $NF_3$ as the primary etchant, with $Cl_2$ used as the profile-control additive. Run #7 therefore utilized a plasma source gas composition comprising 10 sccm $NF_3$ in combination with 75 sccm $Cl_2$. The tantalum nitride etch process conditions were otherwise the same as those used in Run #5, except that, for some reason, the endpoint was not detected nor any etch time recorded. The substitution of $NF_3$ as the primary etchant in the plasma source gas, however, provided a more vertical etch profile than had the $Cl_2$/HBr runs.

In Run #8, all parameters were held as in Run #7, except that the $NF_3$:$Cl_2$ volumetric ratio was changed to 1:1, with flows of 50 sccm of each gas. Etch time was 26.3 sec., giving an etch rate of approximately 1070 Å/min. The feature profile was observed to be slightly more vertical than in Run #7, with the increased proportion of $NF_3$.

For Run #9, all process conditions were held as in Run #8, except that the $NF_3$:$Cl_2$ ratio was changed to 3:1, using 75 sccm $NF_3$ and 25 sccm $Cl_2$. Time was 6 sec., for an etch rate of approximately 880 Å/min. These conditions resulted in a feature profile which was undercut.

For Run #10, all process conditions were held as in Run #9, except that the $NF_3$:$Cl_2$ ratio was changed to 3:2, using 60 sccm $NF_3$ and 25 sccm $Cl_2$ Etch time was 28.1 sec.+10%, for an etch rate of approximately 1000 Å/min. These conditions produced a vertical feature profile.

With process conditions of about 100 sccm of total gas flow, 4 mTorr process chamber pressure, 300 W source power, 50 W bias power, and a substrate temperature of 50° C., the use of a plasma source gas composition having a volumetric ratio of $NF_3$:$Cl_2$ of approximately 3:2 (Run #10, above) provides a tantalum nitride etch rate of approximately 1000 Å per minute, and an essentially vertical etch profile. Ratios of $NF_3$:$Cl_2$ greater than about 3:1 in the source gas may result in undercutting of the edge profile. Ratios of $NF_3$:$Cl_2$ less than about 3:2 in the source gas result in less vertical etch profiles, as do the use of a source gas consisting of $Cl_2$ and HBr, in any proportions tested.

As demonstrated above, by changing the ratio of the primary etchant gas to the profile-control additive gas in the plasma source gas, it is possible to control the etch rate and etch profile of a tantalum nitride gate layer.

Our best results were obtained using a plasma source gas comprising $NF_3$ as the primary etchant gas and $Cl_2$ as the profile-control additive gas, in a volumetric ratio of $NF_3$:$Cl_2$ of approximately 3:2. However, the volumetric ratio of $NF_3$ to $Cl_2$ used in a particular tantalum nitride gate etch process will depend upon a number of factors which pertain to the particular stack of materials being etched, such as the thickness of the tantalum nitride gate, for example. In addition, adjustments will need to be made in view of the apparatus used to carry out the method.

The examples described above all utilized an organic photoresist material for patterning of the tantalum nitride layer. As the organic photoresist is partially consumed during etching of the tantalum nitride layer, free carbon is released, which contributes to the amount of sidewall passivation. Alternatively, a patterned hard masking material (such as silicon nitride) can be used in lieu of a photoresist. If a hard mask is used (with no overlying photoresist), the amount of the primary etchant gas relative to the profile-control additive gas, should be increased in order to provide the optimum balance between etch rate and sidewall passivation.

The above described preferred embodiments are not intended to limit the scope of the present invention, as one skilled in the art can, in view of the present disclosure, expand such embodiments to correspond with the subject matter of the invention claimed below.

I claim:

1. A method of etching a patterned tantalum nitride layer within a semiconductor structure, comprising exposing a layer of tantalum nitride to a high-density plasma generated from a source gas comprising a combination of a primary etchant gas which is an inorganic chlorine-comprising gas, and a profile-control additive which is an inorganic bromine-comprising gas.

2. The method of claim 1, wherein said inorganic chlorine-comprising gas is selected from the group consisting of $Cl_2$, HCl, and $BCl_3$.

3. The method of claim 2, wherein said inorganic chlorine-comprising gas is $Cl_2$.

4. The method of claim 1, wherein said inorganic bromine-comprising gas is HBr.

5. The method of claim 1, wherein said inorganic bromine-comprising gas is HBr, and said inorganic chlorine-comprising gas is $Cl_2$.

6. The method of claim 1, wherein a volumetric ratio of said inorganic chlorine-comprising gas to said inorganic bromine comprising gas in the plasma source gas is in the range from about 3:1 to about 1:3.

7. The method of claim 6, wherein the volumetric ratio of said inorganic chlorine-comprising gas to said inorganic bromine comprising gas in the plasma source gas is within the range from about 2:1 to about 1:2.

8. The method of claim 5, wherein a volumetric ratio of $Cl_2$:HBr in the plasma source gas is within the range from about 2:1 to about 1:2.

9. The method of claim 8, wherein the volumetric ratio of $Cl_2$:HBr in the plasma source gas is within the range from about 2:1 to about 1:1.

10. The method of any of claims 1–9, wherein a semiconductor structure being etched has no exposed layer of organic photoresist capable of contributing carbon to said high-density plasma.

11. A method of etching a patterned tantalum nitride layer within a semiconductor structure, comprising exposing a layer of tantalum nitride to a high-density plasma generated from a source gas comprising a combination of a primary etchant gas which is a fluorine-comprising gas, and a profile-control additive which is an inorganic chlorine-comprising gas, wherein the substrate temperature during etching ranges from about 10° C. to about 100° C.

12. The method of claim 11, wherein said fluorine-comprising gas is selected from the group consisting of $SF_6$, $NF_3$, and $CF_4$.

13. The method of claim 11, wherein said fluorine-comprising gas is selected from the group consisting of $SF_6$ and $NF_3$.

14. The method of claim 13, wherein said fluorine-comprising gas is $NF_3$.

15. The method of claim 11, wherein said inorganic chlorine-comprising gas is selected from the group consisting of $Cl_2$, HCl, and $BCl_3$.

16. The method of claim 15, wherein said chlorine-comprising gas is $Cl_2$.

17. The method of claim 11, wherein said fluorine-comprising gas is $NF_3$ and said chlorine-comprising gas is $Cl_2$.

18. The method of claim 11, wherein the volumetric ratio of said fluorine-comprising gas to said inorganic-chlorine comprising gas in said source gas is within the range of about 10:1 to about 1:10.

19. The method of claim 17, wherein the volumetric ratio of said inorganic fluorine-comprising gas to said inorganic chlorine-comprising gas in said source gas is within the range of about 3:1 to about 1:3.

20. The method of claim 17, wherein the volumetric ratio of $NF_3$:$Cl_2$ is within the range of about 10:1 to about 1:10.

21. The method of claim 19, wherein the volumetric ratio of $NF_3$:$Cl_2$ is within the range of about 3:1 to about 1:3.

22. The method of any of claims 1–9, wherein carbon is present in said high-density plasma.

23. The method of claim 22, wherein the presence of carbon in said high-density plasma is attributable to the breakdown under plasma conditions of an organic photoresist layer present in the semiconductor structure being etched.

24. The method of any of claims 11–21, wherein carbon is present in said high-density plasma.

25. The method of claim 24, wherein the presence of carbon in said high-density plasma is attributable to the breakdown under plasma conditions of an organic photoresist layer present in the semiconductor structure being etched.

* * * * *